(12) United States Patent
Billon

(10) Patent No.: US 6,225,651 B1
(45) Date of Patent: May 1, 2001

(54) STRUCTURE WITH A MICRO-ELECTRONIC COMPONENT MADE OF A SEMI-CONDUCTOR MATERIAL DIFFICULT TO ETCH AND WITH METALLIZED HOLES

(75) Inventor: Thierry Billon, Coublevie (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 09/095,651

(22) Filed: Jun. 11, 1998

(30) Foreign Application Priority Data

Jun. 25, 1997 (FR) .................................................. 97 07922

(51) Int. Cl.⁷ .............................. H01L 29/06; H01L 29/41
(52) U.S. Cl. .......................... 257/200; 257/190; 257/77; 257/621; 257/774; 257/777
(58) Field of Search ..................................... 257/190, 200, 257/506, 621, 777, 774, 751, 77

(56) References Cited

U.S. PATENT DOCUMENTS

| 5,343,071 | | 8/1994 | Kazior et al. . | |
|---|---|---|---|---|
| 5,350,948 | * | 9/1994 | Maehara | 257/751 |
| 5,426,072 | * | 6/1995 | Finnlla | 257/777 |
| 5,436,174 | | 7/1995 | Baliga et al. . | |
| 5,574,295 | | 11/1996 | Kurtz et al. . | |
| 5,880,491 | * | 3/1999 | Soref | 257/190 |
| 5,920,122 | * | 7/1999 | Matsumoto | 257/751 |
| 6,002,177 | * | 12/1999 | Gaynes | 257/777 |

FOREIGN PATENT DOCUMENTS 0 317 445    5/1989   (EP) .

OTHER PUBLICATIONS

Patent Abstracts of Japan, vol. 017, No. 110 (E–1329), Mar. 8, 1993, JP 04 293 234, Oct. 16, 1992.

S. Linder, et al., Proceeding of the Workshop on Micro Electro Mechanical Systems, No. 7, pp. 349–354, "Fabrication Technology for Wafer Through–Hole Interconnections and Three–Dimensional Stacks of Chips and Wafers", Jan. 25–28, 1994.

L. Di Cioccio, et al., Electronics Letters, vol. 32, No. 12, pp. 1144/1145, "Silicon Carbide on Insulator Formation Using the Smart Cut Process", Jun. 6, 1996.

* cited by examiner

Primary Examiner—Jerome Jackson, Jr.
(74) Attorney, Agent, or Firm—Oblon, Spivak, McClelland, Maier & Neustadt, P.C.

(57) ABSTRACT

The invention relates to a structure comprising a micro-electronic component (20) produced in a semi-conductor material difficult to etch. This structure is obtained by rigidly fixing a thin film (12) of the semi-conductor material that is difficult to etch onto the surface before attaching a first substrate made of a material that is easy to etch and which serves as a support. The micro-electronic component (20) is produced in the thin film (12) and a hole (33) passing right through is etched in the structure and metallized (35) in such a way that it electrically connects an electrode (18) formed on the back surface of the first substrate to an electrode (24) of the micro-electronic component (20).

10 Claims, 3 Drawing Sheets

STRUCTURE WITH A MICRO-ELECTRONIC COMPONENT MADE OF A SEMI-CONDUCTOR MATERIAL DIFFICULT TO ETCH AND WITH METALLIZED HOLES

TECHNOLOGICAL FIELD

This invention relates to a structure with a microelectronic component made of a semi-conductor material difficult to etch and with metallized holes.

More precisely, it relates to the field of producing integrated circuits on semi-conductor materials with a large forbidden band, such as silicon carbide and gallium nitride. It is mainly concerned with structures or electronic devices that require metal electrodes to be carried on the back face of the components. In a more particular way, it relates to the creation of metallized holes that pass through an active layer of semi-conductor components.

Silicon carbide and gallium nitride are semiconductor materials with a large forbidden band which have physical and electrical properties that make them suitable for hyperfrequency power electronic applications electronic applications operating at high temperatures, optronic transmission or detection applications working in the ultra-violet range.

The development of these materials is at present in the development phase. In the case of silicon carbide, it is noted that at present there is a great difference in the crystalline quality between thin films made epitaxial on the same semi-conductor (homo-structure) and thin films produced on another material (hetero-structure). The thin films obtained in accordance with the second method are generally polycrystalline or granular mono-crystalline or may also include numerous defects and dislocations. This has, as a consequence, a significant general degradation of the electrical characteristics of the electronic components produced on this structure. In addition, the crystallographic arrangements of this semi-conductor are such that they limit the possibility of controlling whether one crystalline polytype is obtained rather than another. By way of example, the cubic kind of polytype called 3C—SiC or βSiC is the only crystalline polytype that can be produced on silicon (cubic system). However, because of its electrical properties, this polytype is not the best candidate for the majority of electronic devices, the polytypes of the α-SiC family of the hexagonal kind called 4H and 6H—SiC performing better in this case. These are at present developed on massive substrates of the same kind and cannot be made epitaxial on silicon. This method of development does not permit the production of structures where a thin film of silicon carbide, of very good crystalline quality is arranged on other insulating and/or semiconductor materials such as silicon oxide and silicon respectively. The production of an insulator embedded in a homo-structure is possible using ionic implantation methods but this method generally leads to films being obtained that include a high level of defects that are harmful to the production of semiconductor components.

Only the present-day methods of transferring thin films by sticking allow the creation of structures that include a thin film that can be used for the development of modern semi-conductor components. This sticking method can be associated, either with a prior implantation of species that generate a fracture zone, or with a method of removal by etching, honing or polishing which leads to the isolation of a thin film.

Silicon carbide is a material which is very stable both chemically and physically within the temperature range of 0 to 1000° C. The hardness and the density of this material are such that etching of this material is very difficult. Etching by a wet route is carried out in molten salt baths at temperatures above 500° C.

Methods of etching silicon carbide by a dry route require numerous masking studies to be made to find the correct etching conditions. In a general way, Reactive Ion Etching (RIE) equipment enables etching speeds less than 0.2 µm/min to be achieved. Systems employing high flux densities (plasma assisted by micro-waves) are the only ones at present that give speeds greater than previous speeds. The different types of masks studied are of the organic or the mineral type. Contrary to masks of the organic type (photosensitive resins) which permit very small depths of etched areas (less than 0.5 µm), masks of the mineral type (nickel-aluminium) generate very high etching selectivities. These selectivities allow etched depths of the order of a few micro-metres to be achieved, a performance obtained together with "reasonable" etching speed. The best etching results by a dry route are currently speeds of the order of 0.3 µm/min, the depths of the etched zones being of the order of a few micro-meters. These results are given in the following articles:

J. B. Casady et al. "Reactive Ion Etching of 6H—SiC using $NF_3$", International Conference on Silicon Carbide and Related Materials 1995, (Kyoto, Japan), Inst. Phys. Conf. Ser. No. 142, Chapter 3;

F. Lanois et al. "Angle Etch Control for Silicon Power Devices" Applied Physics Letters, Vol. 69, 8th July 1996).

The thickness of present-day SiC substrates being between 200 and 400 µm, the etching times to create holes passing right through cannot be contemplated for a massive silicon carbide structure (a homo-structure).

The development of gallium nitride, at the present time only in the form of thin films is carried out, in certain cases starting with a substrate made of silicon carbide. The problem is therefore identical for components produced on a thin film of gallium nitride.

Among the applications envisaged for these circuits developed on silicon carbide or gallium nitride one may mention hyperfrequency power applications and matrices and component networks.

For the first type of application, the components will operate at high frequencies (about 1 GHz and beyond) and will deal with high power. These components, usually produced in silicon and/or gallium arsenide, are then of the "field effect transistor" type. Such applications are in the course of development on silicon carbide or gallium nitride. The sequences that permit the production of such components are very similar to those currently developed for use on silicon or gallium arsenide.

Power systems operating at high frequencies demand the design of transistors having very precise dimensional characteristics. One should mention the very small gate lengths, less than a Am and the large gate widths, of the order of a millimeter. All these devices must be assembled on an insulating or semi-insulating support so as to get as close as possible to maximum accessible performance:high frequencies ($f_T$, $f_{max}$) and high added power efficiencies.

These transistors are designed by numerous gate bars, structures that require the interdigitation and metallization of drains and sources. The same metallization step for the gate contacts and drain contacts forms two respective buses which through their interleaving excludes any contact being made onto the source areas situated in the centre. It is essential that the sources be connected to one another.

The current technology makes use of methods called air bridges, the metallizations being connected to one another through the front face. These methods require a large minimisation of all the parasitic elements (capacities and inductances) which these structures can create. Over and above certain critical values, the general electrical performance of the transistors is then limited by these elements. A second technique consists therefore of creating metallized holes that pass through the entire thickness of the semiconductor material.

The interconnection of all the electrodes of common sources is then made through these metallized holes and lines or metallized planes situated on the rear face of the component. The component to be produced will therefore have to have available gate and drain contacts on the front face and source contacts on the rear face, the majority of the thickness of the substrate being of the insulating, semi-insulating or highly resistive type. Such vertical connections allow in addition, better thermal dissipation of the component.

At the present time, the production of hyperfrequency or optronic components made of silicon carbide or gallium nitride is known. By way of example, reference may be made to the article "4H—SiC MESFET's with 42 GHz fmax" by S. Sriram et al. that appeared in IEEE Electron Device Lett., Vol. 17, No. 7, pp. 369–371, July 1996.

The electrical performance limitations of transistors currently produced essentially come down to the absence of a semi-insulating to insulating substrate (high resistivities greater than a few $10^5$ $\Omega$.cm at ambient temperature) as well as the absence of optimised technologies. The only current demonstrator silicon carbide devices in effect use technologies with metallization through an air bridge. However these are very recent. If the group of current publications on the subject are brought together, one may draw from them as a priority, the absolute necessity of producing devices on a highly resistive to insulating support. The second necessity would be the possibility of creating, on these components one or more vertical connections that pass through the structure connections that allow the creation of tracks appropriate to electrical conduction and to thermal dissipation. This last point is, in effect very critical on an insulating structure or one having rather low coefficients of thermal conductivity. A structure of interest will have to be optimised in this regard with both the embedded insulator (minimisation of the thermal resistance of such a layer through restricting the thickness of this layer; optimisation of the thickness and of the dielectric constant of this layer in order to minimise parasitic hyperfrequency couplings, an optimisation linked to the previous constraint) and the constitution of the substrate support (minimisation of the thermal resistance through limitation of the thickness of this layer optimisation of the thickness, of the resistivity indeed of the insulating nature and of the dielectric constant of this layer in order to minimise parasitic hyperfrequency couplings, an optimisation linked to the previous constraint).

For the second type of application, the components produced on silicon carbide or gallium nitride can be freely arranged in the form of lines and/or matrices. They may be transistors as previously defined, diodes, sensors, passive elements, photo-components and also complex assemblies combining these elements.

Each basic element consequently has metallized lines which are appropriate to itself and also an assembly of contact points so that they may be individually addressed (for a line/column type of matrix addressing for example). The arrangement of the elements between one another requires a high integration density, which excludes any possibility of positioning the addressing connection system on the front face of the final component.

Demonstrations of unitary components have been carried out for a broad range of applications. However, at present significant demonstrators do not exist with a high integration density making use of an assembly in a line or a matrix of unitary components. The absence of techniques with metallized holes is one of the major reasons for the lack of development of the preceding circuits. The main obstacle to the existence of such production methods is the same as in the first case the total etching of the entire thickness of a massive substrate made of silicon carbide is totally unrealisable at present.

DESCRIPTION OF THE INVENTION

This invention makes possible the creation of metallized holes right through a semi-conducting layer of silicon carbide or gallium nitride by conferring on it a limited thickness (of a few $\mu$m) and by making provision for it to rest on a carrier assembly suitable for the target application. The etching techniques at present developed are then completely applicable to such a thickness. The complete opening up of the metallized hole is carried out afterwards by the etching of the carrier substrate.

Therefore the object of the invention is a method of producing a structure comprising a micro-electronic component produced in a semi-conductor material difficult to etch, characterised in that it consists of carrying out the rigid fixing of a thin film of said semi-conductor material difficult to etch on the front face of a first substrate made of a material easy to etch and serving as a support, this rigid fixing supplying said structure, the micro-electronic component being produced in the thin film, a through hole being etched in the structure and metallized in such a way as to electrically connect an electrode formed on the rear face of the first substrate to an electrode of the micro-electronic component.

This method can comprise the following steps preparation of the first substrate to provide it with a front face and a rear face suitable for the following steps, preparation of a second substrate comprising said semi-conductor material difficult to etch in order to confer upon it a front face suitable for the following steps, bringing the first and second substrates into intimate contact through the rigid fixing of their front faces, removal of a part of the second substrate in such a way that only a thin film made up by the semiconductor material difficult to etch is allowed to remain on the front face of the first substrate.

creation of the micro-electronic component on the thin film, with its electrodes, creation of an electrode on the rear face of the first substrate, creation of a hole passing into the structure, between the rear face of the first substrate and the free face of the thin film, metallization of the hole that passes through and the making of electrical contact between this metallized hole and, on the one hand an electrode of the micro-electronic component, and on the other hand an electrode situated on the rear face of the first substrate.

According to a first production method variant, provision can be made, during the step of preparation of the second substrate, for an ionic implantation of this second substrate through its front face so as to demarcate said thin film with the formation of a layer of micro-cavities in the second substrate, the ionic implantation being made with a dose that is sufficient to permit the creation of a fracture line along the layer of micro-cavities during a heat treatment of the layer of micro-cavities carried out in the course of the step consisting of removing a part of the second substrate.

According to a second production method variant, the removal of said part of the second substrate can occur through mechanical machining.

The material that is easy to etch can be silicon, quartz, alumina, sapphire or gallium arsenide.

In the case of a support made of semi-conductor material, it can be of interest (for hyperfrequency applications) to provide it with an insulating layer, because of its low electrical permittivity, in a way that prevents electromagnetic coupling. This insulating layer can be taken from among the family of oxides and nitrides of silicon and aluminium, for example: $SiO_2$, AlN, $Al_2O_3$ or $Si_3N_4$.

The thin film can be constituted by a layer of silicon carbide or gallium nitride with a thickness of about 1 $\mu$m. It may be constituted by a stack of layers of silicon carbide and/or gallium nitride with different electrical conductivities (due to different doping levels or to dopings of a different type).

Also an object of the invention is a structure comprising a micro-electronic component produced in a semi-conductor material difficult to etch, characterised in that it comprises a thin film of said material difficult to etch and in which the microelectronic component is produced, the thin film being rigidly fixed to the front face of a first substrate made of material that is easy to etch and whose rear face supports an electrode, a metallized hole passing right through electrically connecting the rear electrode of the first substrate to an electrode of a micro-electronic component.

BRIEF DESCRIPTION OF THE FIGURES

The invention will be better understood and other advantages and particular features will become apparent on reading the description which follows, given by way of a non-limitative example and accompanied by the appended drawings among which.

DETAILED DESCRIPTION OF EMBODIMENTS OF THE INVENTION

Figure 1A:
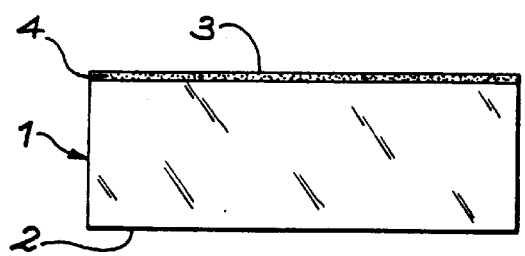
FIGS. 1A to 1J illustrate a first variant of the method of producing a structure including a microelectronic component according to this invention.

The invention can be divided into six phases, each having required knowledge and research in fields as varied as chemistry, the strength of materials and the physics of semi-conductors.

The first phase of the invention consists of preparing two substrates separately. The two substrates can be either of the semi-conductor or insulating type. Hence we are mainly concerned with materials such as Si, AsGa, $SiO_2$, AlN, $Al_2O_3$, silicates or composite materials (superimposed layers) that include these same materials. The two substrates can each have a different diameter. Mono-crystalline silicon carbide and gallium nitride are only available in wafer diameters close to 50 mm while silicon of diameter 300 mm is in the course of becoming the world standard.

In a more precise way, the second substrate includes a thin film of silicon carbide or gallium nitride on the surface of one of its two faces. This thin film can itself be made up by layers with different dopings and different types of conductivity.

The second phase consists of transferring a portion or the whole of this thin film onto a face of the first substrate. This transfer is carried out by the atomic sticking together of each substrate, a technique requiring perfect mastery of the surface chemistry and a technique suited to each type of specific sticking. The thin film can be separated from its original substrate by two methods. In a first case, a specific number of atoms have previously been implanted at a certain depth so as to create a fracture zone. In a second case the second substrate is thinned down with mechanical tools (etching, honing, polishing). These two methods require, in each case precise control of the thickness of the thin film to be separated. The bonding energies of the materials to be treated have a direct influence on the method to be developed. The thin film being transferred to the surface of the first substrate, a structure is obtained on which the micro-electronic component will be produced.

The third phase consists of producing one or more integrated, active or passive, semi-conductor components. These may be transistors, diodes, sensors, passive elements, photo-components or more complex assemblies combining these elements together. The preparation of the structure is of extreme importance at this stage since the thin film must not be separated or degraded by any of the technical sequences that the creation of the integrated components requires. Numerous studies are necessary in order to control the thermal balance to which the substrate is subjected with the transfer. The final technical sequences required for the creation of these integrated components are the metallizations on the front face and on the rear face.

The fourth phase then consists of selectively etching each layer of the preceding structure in the areas where one wishes to make a vertical metal connection. These openings have an approximate size of the order- of a few micrometers. The layers of small thickness are etched by the methods described above (etching by a dry route with polymer or mineral masks). The etching of the thin film of silicon carbide or gallium nitride then only has to deal with a very small thickness of material. By way of example, one may use a dry etching method for silicon carbide with a reactive chemical of the $SF_6$/Ar type in a Distributed Electron Cyclotron Resonance (DECR) apparatus. The etching speeds are then about 0.2 $\mu$m/min, the roughness and the surfaces of the etched area not being degraded by this method. The hole passing through the structure must not modify in a significant way the dimensions fixed in the beginning, the critical parameter being not to leave a cavity that does not pass right through. These techniques are very recent and can make use of double face photo-lithography methods.

The fifth phase consists of creating an electrically insulating layer on the sides of the etched holes. This step can be a combination of thermal oxidation and the deposition of insulating material or materials. It is important to ensure perfect homogeneity of a deposit over the whole depth of the hole.

The sixth and final phase consists of the metallization of the etched hole and the tracks on the front and rear faces of the structure. This step makes use of metallization methods such as sputtering deposition, vapour phase deposition and electrolytic deposition. It must provide perfect homogeneity of the deposit over the entire depth of the hole during successive metallizations. This homogeneity is necessary in order to totally plug the hole without leaving any cavities. These final metallization steps permit the creation of the connections between each equipotential element.

A first example of an implementation of the method according to this invention will now be described making reference to FIGS. 1A to 1J. This example relates to the creation of a metallized hole in a structure that includes a field effect transistor made of silicon carbide, this metallized hole allowing the electrical connection of the source of the field effect transistor to a metal line deposited on the rear face of the structure. The transistor is produced on a thin film of silicon carbide joined onto a silicon substrate of high resistivity.

FIG. 1A represents a first substrate 1 made of high resistivity silicon and having a rear face 2 and a front face 3 which have been treated in order to be flat and parallel to one another. The front face 3 has also been treated to have a thermal oxide layer 4.

Figure 1B:
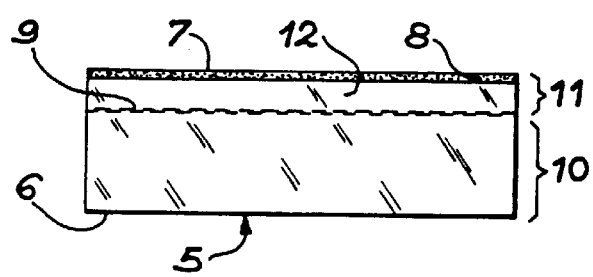

FIG. 1B represents a second substrate 5 made of silicon carbide and having a rear face 6 and a front face 7. The substrate 5 is initially constituted by a silicon carbide mass which has received on the front face side 7, layers of the same material made epitaxial. A layer of silicon oxyde 8 is then deposited on the epitaxial layers. In order to demarcate a thin film in the substrate 5, hydrogen ions have been implanted through the front face 7 to a mean depth determined by their implantation energy. These implanted ions cause the formation of a layer of micro-cavities 9 that separate the substrate 5 into two regions: a lower region 10 and an upper region 11 that includes the layer of oxide 8 and a part 12 intended to constitute the thin film. For more details relating to this method of producing a thin film by ionic implantation, reference may be made to document FR-A-2 681 472.

Figure 1C:
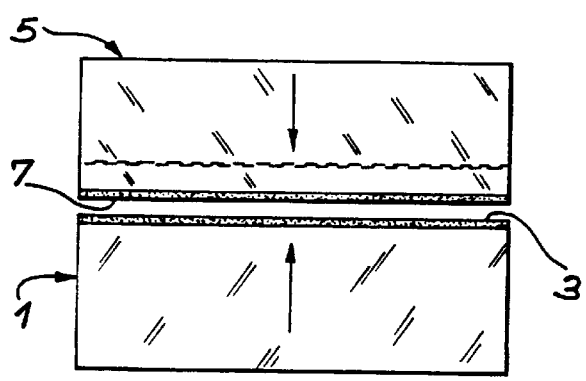

FIG. 1C illustrates the bringing into contact of substrates 1 and 5 through their first faces 3 and 7 and their rigid fixing by a technique of atomic sticking.

Figure 1D:
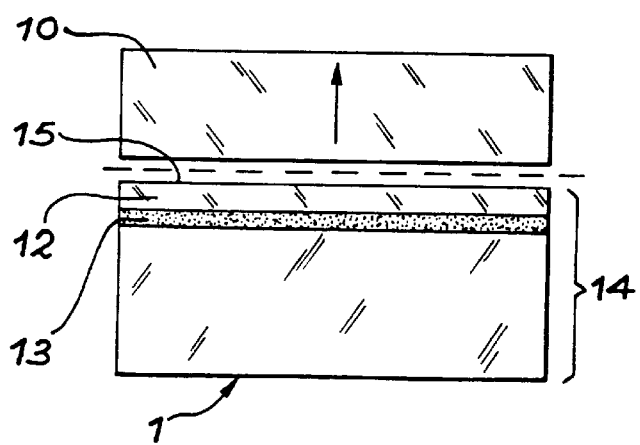

FIG. 1D illustrates the step of removing region 10 from the second substrate of the assembly rigidly fixed in the preceding step. This separation of the second substrate into two parts is obtained by a heat treatment of the layer 9 of micro-cavities as disclosed in document FR-A-2 681 472. This heat treatment is carried out at a temperature that is sufficient to create a fracture line at the layer of micro-cavities. A structure 14 is obtained, formed by the superposition of the first substrate 1 made of silicon, by a layer of silicon oxide 13 (resulting from the stacking of oxide layers 4 and 8) and the thin film of silicon carbide 12 having a free face 15.

Figure 1E:
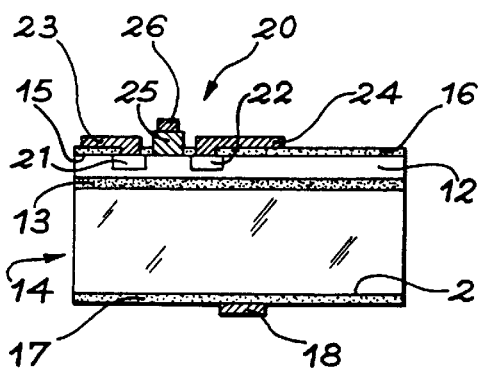

FIG. 1E represents the structure 14 on which a microelectronic component 20, in this case a field effect transistor, has been produced in the thin film 12 of silicon carbide. The transistor 20 comprises drain 21 and source 22 regions respectively connected to drain 23 and source 24 electrodes. The free face 15 of the thin film 12 supports the gate 25 of the transistor, which is covered by a gate electrode 26. An oxide layer 16 deposited on the face 15 of the thin film 12 passivates this face and insulates the electrodes of the transistor 20 from one another. The rear face 2 of the structure is also covered by a layer of oxide 17. A metal line 18 has been created by lithography on the oxide layer 17. It is intended to constitute an electrode on the rear face of the structure. The rear face electrode can possibly cover all of this face as a full sheet electrode.

Figure 1F:
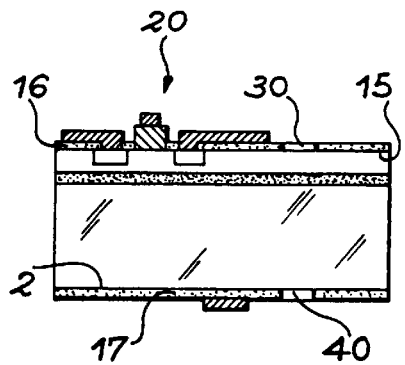
Figure 1G:
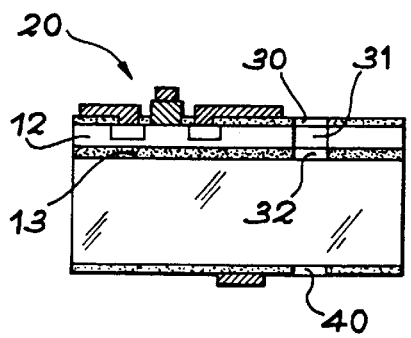
Figure 1H:
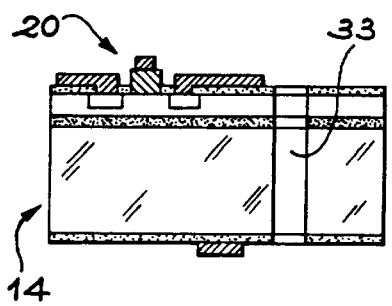

The following phase of the method consists of selectively etching each layer of the structure obtained in order to produce the through hole. This is illustrated in FIGS. 1F to 1H. FIG. 1F shows the etching of oxide layers 16 and 17 respectively covering faces 15 and 2 of the structure. This etching causes two aligned openings 30 and 40 to appear respectively in oxide layers 16 and 17. It may be a dry etching ($CHF_3$, Ar) since these layers are silica.

FIG. 1G shows the structure obtained after etching the thin film 12 and the oxide layer 13 as a continuation of opening 30. The thin film 12 of silicon carbide can be treated by dry etching($CHF_3$, Ar). Hence one obtains in extension of the opening 30, a hole 31 in the thin film 12 and a hole 32 in the oxide layer 13.

The through hole can then be obtained by deep etching of the part of the structure 14 made of silicon. The through hole 33 illustrated in FIG. 1H is then obtained.

The through hole can possibly be obtained directly without double face lithography.

Figure 1I:
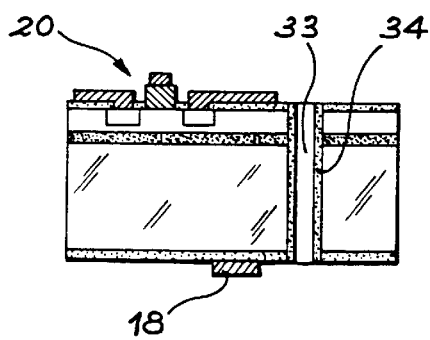

According to the fifth phase of the method, the walls of the hole 33 are covered by an insulating layer 34, as illustrated in FIG. 1I.

One then proceeds to the total metallization of the hole 33 by deposition of a layer of metal of low resistivity such as silver, gold, copper, aluminium or by the deposition of two metallic layers, the intermediate layer called a barrier layer being situated between the substrate and the layer of metal of low resistivity and having the function of preventing the diffusion of the low resistivity material into the substrate. This intermediate layer can be, for example, Ti, TiN, Pt, Ni or TiW. This layer, produced in the materials previously mentioned can permit the use of a method of depositing the low resistivity metal by electrolysis. However, it is to be feared that the use of TiN does not allow the production of a homogeneous deposit of low resistivity material on the substrate assembly because its resistivity is too high.

The total metallization of the hole 33 can also be obtained by deposition of three metal layers, the intermediate layer being made up by two layers of diffusion barrier material previously mentioned.

Figure 1J:
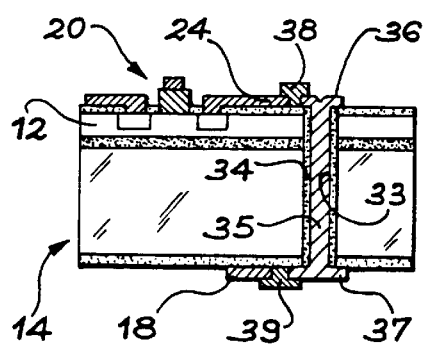

FIG. 1J shows the electrical connection obtained under reference number 35. The connection 35 runs over onto the front face of the structure 14 through an end 36 and onto the rear face of the structure 14 through an end 37.

A final metallization step allows the electrical linking of the connection 35 to the source electrode 24 on the front face of the structure and to the metal line 18 on the rear face of the structure. FIG. 1J shows the connections made by the final metallization step: a metal bridge 38 connects the source electrode 24 to the end 36 of the connection 35, a metal bridge 39 connects the metal line 18 to the end 37 of the connection 35. These metal bridges are defined by lithography and etching steps.

A second example of implementing the method according to this invention will now be described. It relates to the production of a metallized hole that allows one to connect the source of a field effect transistor made of gallium nitride to a metal line deposited on the rear face of the structure. The thin film of gallium nitride is joined onto a substrate made of high resistivity silicon.

A first substrate of high resistivity silicon, with a thermal oxide layer on one of its faces, is prepared. It is identical to that shown in FIG. 1A.

Figure 2A:
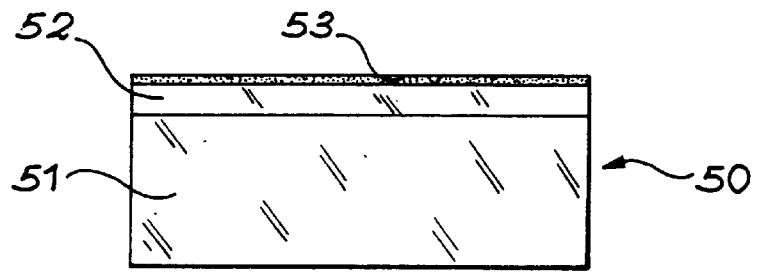
FIGS. 2A to 2C illustrate a second variant of the method of producing a structure including a microelectronic component according to this invention.
Figure 2B:
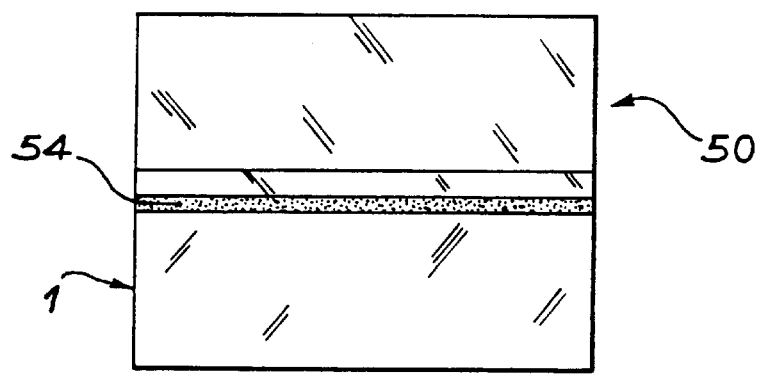

FIG. 2A represents a second substrate 50 made up successively of a silicon carbide mass 51, a layer 52 of epitaxial gallium nitride and an oxide layer 53. The two substrates are brought into contact along their oxidised faces and rigidly fixed by atomic sticking. This is as represented in FIG. 2B where reference number 54 designates the oxide layer that results from the stacking of oxide layers 4 (see FIG. 1A) and 53 (see FIG. 2A).

Figure 2C:
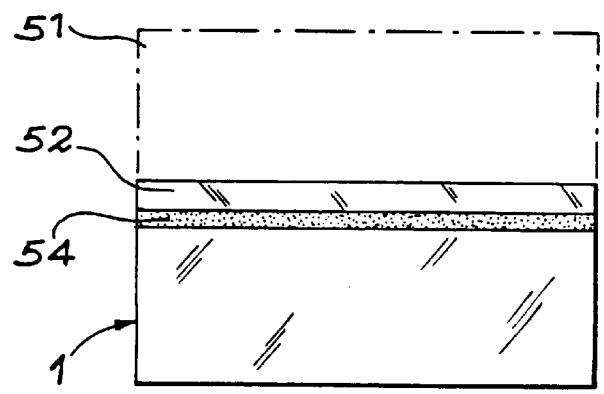

One then proceeds to a thinning down by honing the second substrate 50. This thinning down allows one to remove the silicon carbide mass 51 and to cause the gallium nitride layer 52 to appear which then constitutes a thin film on which the field effect transistor will be developed. This is illustrated in FIG. 2C.

The method then proceeds as for the first example; creation of the field effect transistor, formation and metallization of the through hole, electrical connection of the metallized hole to the source electrode of the transistor on the one hand and to the metal line situated on the rear face on the other hand.

What is claimed is:

1. Structure comprising:

a micro-electronic component produced in a thin film of a difficult to etch semiconductor material rigidly fixed onto a front face of a first substrate made of a material easy to etch, a rear face of said first substrate supporting a rear electrode; and a metallized through hole extending from the rear face of said first substrate through said thin film and electrically connecting the rear electrode of the first substrate to an electrode of the micro-electronic component, wherein the material difficult to etch comprises at least one of silicon carbide and gallium nitride.

2. Structure comprising:

a micro-electronic component produced in a thin film of a difficult to etch semiconductor material rigidly fixed onto a front face of a first substrate made of a material easy to etch, a rear face of said first substrate supporting a rear electrode, and a metallized through hole extending from the rear face of said first substrate through said thin film and electrically connecting the rear electrode of the first substrate to an electrode of the micro-electronic component, wherein said thin film comprises a stack of layers of materials selected from the group consisting of silicon carbide and gallium nitride, said layers having different electrical conductivities.

3. Structure according to claims 1 or 2, wherein the material that is easy to etch is selected from the group consisting of silicon, quartz, alumina, sapphire and gallium arsenide.

4. Structure according to claim 2, wherein an insulating film separates the thin film from the material that is easy to etch.

5. Structure according to claim 4, wherein the insulating layer comprises a material selected from the group consisting of $SiO_2$, AlN, $Al_2O_3$ and $Si_3N_4$.

6. Structure according to claim 2, wherein the walls of the through hole are lined with an electrical said thin film and electrically connecting the rear electrode of the first substrate to an electrode of the micro-electronic component.

7. Structure according to claims 1 or 2, wherein the through hole comprises a metallized layer of a metal of low resistivity.

8. Structure according to claim 7, wherein the metal of low resistivity is a material selected from a group consisting of silver, gold, copper and aluminum.

9. Structure according to claim 7, wherein a barrier layer is provided under said metallized layer, the barrier layer configured to prevent diffusion of the metal of low resistivity.

10. Structure according to claims 1 or 2, wherein the microelectronic component comprises a field effect transistor.

* * * * *